US010256111B2

(12) United States Patent
Lau et al.

(10) Patent No.: US 10,256,111 B2
(45) Date of Patent: Apr. 9, 2019

(54) CHEMICAL MECHANICAL POLISHING AUTOMATED RECIPE GENERATION

(71) Applicant: Applied Materials, Inc., Santa Clara, CA (US)

(72) Inventors: Eric Lau, Santa Clara, CA (US); King Yi Heung, Union City, CA (US); Charles C. Garretson, Sunnyvale, CA (US); Jun Qian, Sunnyvale, CA (US); Thomas H. Osterheld, Mountain View, CA (US); Shuchivrat Datar, Santa Clara, CA (US); David Chui, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/621,638

(22) Filed: Jun. 13, 2017

(65) Prior Publication Data

US 2018/0005842 A1    Jan. 4, 2018

Related U.S. Application Data

(60) Provisional application No. 62/357,032, filed on Jun. 30, 2016.

(51) Int. Cl.
*H01L 21/32* (2006.01)
*H01L 21/321* (2006.01)
(Continued)

(52) U.S. Cl.
CPC .......... *H01L 21/3212* (2013.01); *G01B 11/03* (2013.01); *G01B 11/06* (2013.01);
(Continued)

(58) Field of Classification Search
CPC ... H01L 21/32; H01L 21/321; H01L 21/3212; H01L 21/30; H01L 21/304; H01L 21/31;
(Continued)

(56) References Cited

U.S. PATENT DOCUMENTS

| 9,132,523 B2 | 9/2015 | Lee et al. |
| 2007/0123046 A1* | 5/2007 | Ravid ................... B24B 37/042 438/692 |

(Continued)

FOREIGN PATENT DOCUMENTS

KR    20100079199 A    7/2010

OTHER PUBLICATIONS

Writen Opinion and International Search Report for PCT/US2017/036620 dated Sep. 29, 2017.

*Primary Examiner* — Monica D Harrison
(74) *Attorney, Agent, or Firm* — Patterson + Sheridan, LLP

(57) ABSTRACT

A method for polishing dies locations on a substrate with a polishing module. A thickness at selected locations on the substrate is premeasured at a metrology station, each location corresponding to a location of a single die. The thickness obtained by the metrology station for the selected locations of the substrate is provided to a controller of a polishing module. The thickness corrections for each selected location on the substrate are determined. A polishing step in a polishing recipe is formed from the thickness correction for each selected location. A polishing parameter for each die location is calculated for the recipe.

18 Claims, 6 Drawing Sheets

(51) Int. Cl.
  *G01B 11/03* (2006.01)
  *G01B 11/06* (2006.01)
  *H01L 21/304* (2006.01)
  *H01L 21/3105* (2006.01)
  *H01L 21/66* (2006.01)

(52) U.S. Cl.
  CPC ...... *H01L 21/304* (2013.01); *H01L 21/31053* (2013.01); *H01L 22/00* (2013.01)

(58) Field of Classification Search
  CPC .......................... H01L 21/31; H01L 21/3105; H01L 21/31053
  USPC ........................................................ 438/406
  See application file for complete search history.

(56) References Cited

U.S. PATENT DOCUMENTS

| | | |
|---|---|---|
| 2009/0298388 A1 | 12/2009 | Li et al. |
| 2012/0053721 A1 | 3/2012 | Shanmugasundram et al. |
| 2015/0348797 A1 | 12/2015 | Hui et al. |

\* cited by examiner

CHEMICAL MECHANICAL POLISHING AUTOMATED RECIPE GENERATION

CROSS-REFERENCE TO RELATED APPLICATIONS

This application claims benefit of U.S. Provisional Application Ser. No. 62/357,032, filed Jun. 30, 2016, of which is incorporated by reference in its entirety.

BACKGROUND

Field

Embodiments of the present disclosure generally relate to methods and apparatus for polishing a substrate, such as a semiconductor wafer. More particularly, to methods and apparatus for polishing local areas of a substrate in an electronic device fabrication process.

Description of the Related Art

Bulk chemical mechanical polishing is one process commonly used in the manufacture of high-density integrated circuits to planarize or polish a layer of material deposited on a substrate by moving a feature side, i.e., a deposit receiving surface, of the substrate in contact with a polishing pad while in the presence of a polishing fluid. The polishing pad is generally much larger than the substrate diameter. In a typical polishing process, the substrate is retained in a carrier head that urges or presses the backside of the substrate toward a polishing pad that is larger than the substrate. Material is removed globally across the surface of the feature side of the substrate that is in contact with the polishing pad through a combination of chemical and mechanical activity.

However, conventional bulk chemical mechanical polishing processes may not yield a substrate that sufficiently planarized due to localized high spots which place portions of the substrate out of specification. The localized high spots may be removed using a CMP system equipped with a small polishing pad (i.e., pad much smaller than the substrate) suitable for polishing areas as small as a specific die location. However, with many die locations and with varying topography, creating polishing recipes for such small pad CMP systems has proven challenging, and often creates additional problems by over or under polishing the high spot, or polishing the area adjacent the high spot in an undesirable manner.

Therefore, there is a need for a method and apparatus that removes materials from local areas of the substrate.

SUMMARY

Embodiments of the present disclosure generally relate to methods and apparatus for polishing local areas of a substrate, such as a semiconductor wafer and the like. In one embodiment, a method for polishing dies locations on a substrate with a polishing module is disclosed. A thickness at selected locations on the substrate is premeasured at a metrology station, each location corresponding to a location of a single die. The thickness obtained by the metrology station for the selected locations of the substrate is provided to a controller of a polishing module. The thickness corrections for each selected location on the substrate are determined. A polishing step in a polishing recipe is formed from the thickness correction for each selected location. A polishing parameter for each die location is calculated for the recipe.

Other embodiments include, without limitation, a computer-readable medium that includes instructions that enable a processing unit to implement one or more aspects of the disclosed methods as well as a system having a processor, memory, and application programs configured to implement one or more aspects of the disclosed methods.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
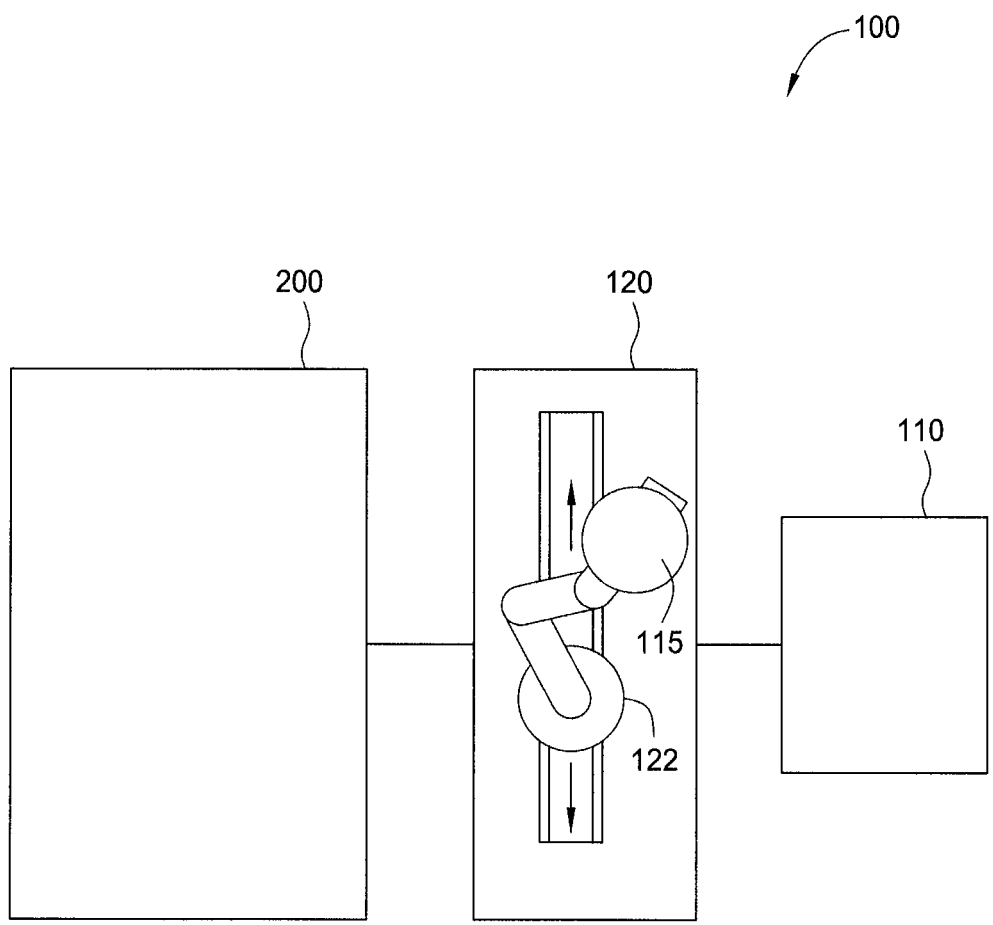
FIG. 1 is a schematic for a polishing system having a metrology station and a polishing module.

The present disclosure is for a method used by a polishing system particularly suited for polishing portions of a substrate during a fabrication process. The method entails the automatic generation of separate polishing steps for each respective portion, location, or die, on the substrate. The method additionally includes techniques for modifying the polishing operations to maintain and improve polishing results for subsequent substrates.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized for storing a program product which, when executed, is configured to perform a method for polishing a substrate. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code may be written in any one or more programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a schematic for a polishing system 100 having a metrology station 110. The polishing system 100 additionally has a polishing station 200. A factory interface 120 may be disposed between the polishing station 200 and the metrology station 110. The factory interface 120, metrology station 110 and polishing station 200 may be electronically coupled to transfer data and information between the respective stations of the polishing system 100.

The factory interface 120 has a robot 122. The robot 122 is configured to move substrates 115 between the polishing station 200 and the metrology station 110. The robot 122 may also be configured to move substrates 115 in and out of the polishing system 100.

Figure 2:
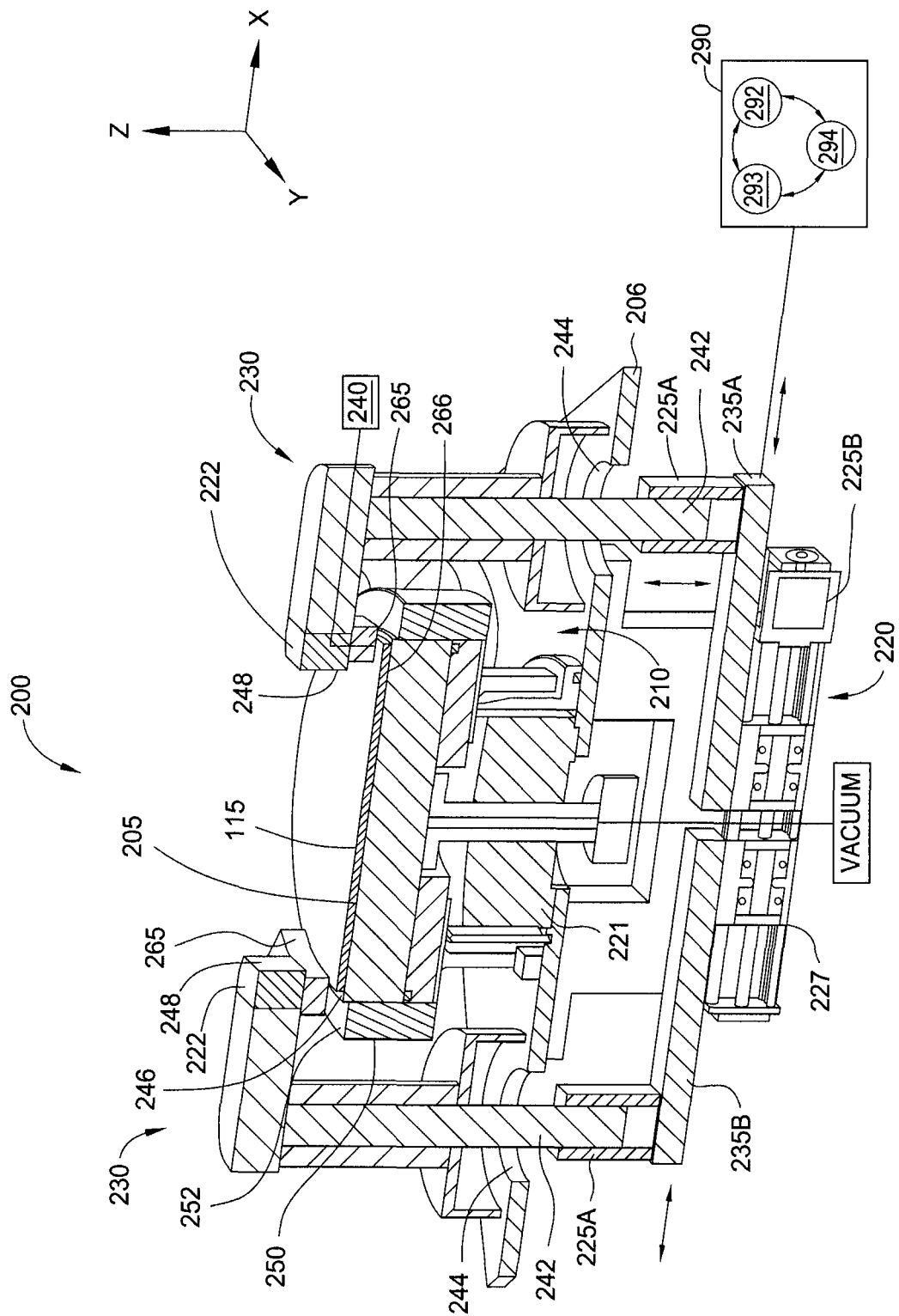
FIG. 2 is a schematic sectional view of one embodiment of the polishing module depicted in FIG. 1.
Figure 3:
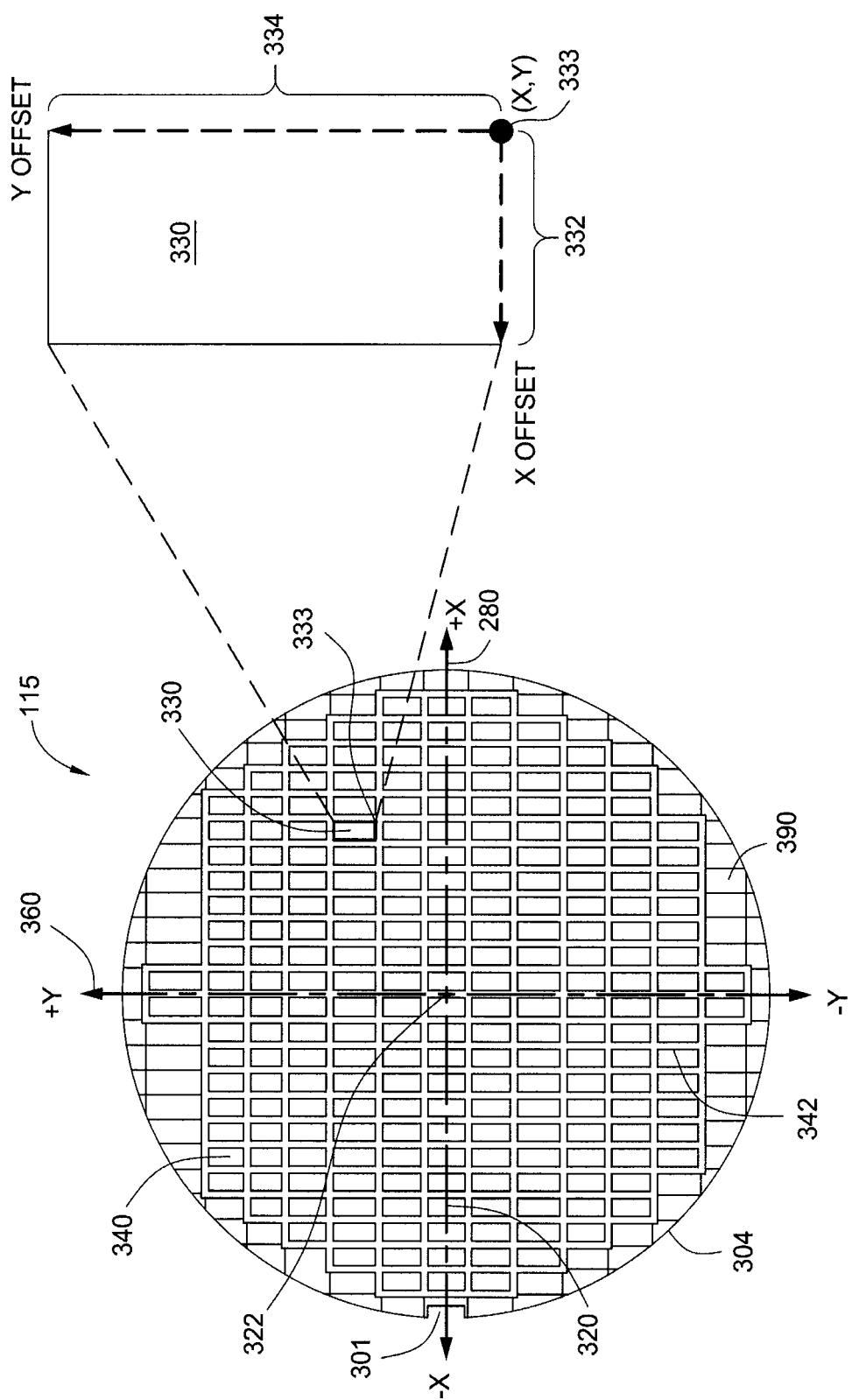
FIG. 3 is a plan view of a substrate suitable for polishing in the polishing module shown in FIG. 1.

Turning briefly to FIG. 3, FIG. 3 is a plan view of the substrate 115 suitable for polishing in the polishing station 200 shown in FIGS. 1 and 2. The substrate 115 may have a circular shape with a center 322 and an outer diameter 304. The outer diameter 304 may have a flat or notch 301 for orienting the substrate 115. In one embodiment, the outer diameter 304 is 300 mm. Alternately, the substrate 115 may have any suitable shape and size.

The substrate 115 may be mapped with a coordinate system 320 such as a Cartesian coordinate system having a y-axis 360 and an x-axis 380. The origin, i.e., (0,0) of the coordinate system 320 may be located anywhere on or off the substrate 115. In one embodiment, the origin is the center 322 of the substrate 115. It should be appreciated that any coordinate system, such as a polar coordinate system, is suitable for defining a location 333 on the substrate 115. The location 333 has a first offset 332 which may correspond to an 'X' value on the x-axis 380 of the coordinate system 320. Similarly, the location 333 has a second offset 334 which may correspond to a 'Y' value on the y-axis 360 of the coordinate system 320. Thus, the location 333 may be defined simply by (X,Y). The location 333 may identify a first die 330.

The substrate 115 may have local areas 342. The local areas 342 largely represent a portion of the substrate 115. In one embodiment, each of the local areas 342 may be sized to and correspond to a plurality of dies 340. In another embodiment, each of the local areas 342 may respectively correspond to a single one of the dies 340. The dies 340 may be defined in a surface area on the substrate 115 of about 6 millimeters (mm) by about 6 mm, or greater, such as up to about 20 mm by about 20 mm. Knowing the size of the die 340 and the orientation of the substrate 115 allows each die 340 to be defined by a location (X,Y) such as in the case of location 333 identifying the first die 330. The substrate 115 may additionally have areas 390 not corresponding to any of the dies 340. In one embodiment, the substrate 115 has seventy-two dies 340. In another embodiment, the substrate 115 has over three hundred dies 340. The size of the substrate 115 and of the dies 340 determine the number of dies 340 the substrate 115 may contain.

Returning back to FIG. 1, the substrates 115 may be moved by the robot 122 to the metrology station where the substrate 115 is measured. The metrology station 110 may perform a plurality of thickness or flatness measurements across the substrate 115. The metrology station 110 may determine that the thickness and/or flatness at localized areas of the substrate 115 are out of specification, i.e., outside of a predefined tolerance window, such as the thickness being too large or too thin. For example, the metrology station 110 may determine the thickness of the substrate at each die location. Metrology stations 110 suitable for measuring the thickness are available from Nanometrics and Nova Measuring Instruments.

The information, i.e., data, concerning the substrate 115 collected by the metrology station 110 may be transferred throughout the polishing system 100 and used to perform processing or other operations on the substrate 115. For example, the locations on the substrate 115 measured by the metrology station 110, determined to be too thick, may be polished by the polishing station 200 to bring the substrate back into specification. In some scenarios, the metrology station 110 may record thicknesses of all the dies 340 on the substrate 115 as being specification and that information is associated with the substrate 115 as it is moved by the robot 122 to a next location in the manufacturing process away from the polishing system 100.

Alternately or in conjunction with the metrology station 110, a metrology device (not shown)) may also be coupled to the polishing station 200. The metrology device may be utilized to provide an in-situ metric of polishing progress by measuring a metal or dielectric film thickness on the substrate (not shown) during polishing. The metrology device may be an eddy current sensor, an optical sensor, or other sensing device that may be used to determine metal or dielectric film thickness.

FIG. 2 is a schematic sectional view of one embodiment of the polishing station 200. The polishing station 200 includes a base 206 supporting a chuck 210, which rotatably supports the substrate 115 thereon. The chuck 210 may be a vacuum chuck, or other suitable device for holding the substrate 115 thereon. The chuck 210 is coupled to a drive device 221, which may be a motor or actuator, providing at least rotational movement of the chuck 210 about an axis oriented in the Z direction. The polishing station 200 may be used before a conventional bulk polishing process or after a conventional bulk polishing process to polish local areas of the substrate 115 and/or perform thickness corrections on the substrate 115. In some embodiments, the polishing station 200 may be used to polish and/or remove material in an area above individual dies 340 on the substrate 115.

The substrate 115 is disposed on the chuck 210 in a "face-up" orientation such that the feature side of the substrate 115 faces one or more polishing pad assemblies 265. Each of the one or more polishing pad assemblies 265 is utilized to polish or remove material from the substrate 115. The polishing pad assemblies 265 may be used to remove material from local areas 342 of the substrate 115 and/or polish a peripheral edge along the outer diameter 304 of the substrate 115 before or after polishing of the substrate 115 in a conventional bulk chemical mechanical polishing (CMP) system. The polishing pad assembly 265 may be round, oval shape, or any polygonal shape, such as square or rectangular. The polishing pad assembly 265 includes a contact portion 266. The contact portion 266 may be a polymeric polishing pad material, such as polyurethane, polycarbonate, fluoropolymers, polytetrafluoroethylene (PTFE), polyphenylene sulfide (PPS), or combinations thereof, and the like. The contact portion 266 may further comprise open or closed cell foamed polymers, elastomers, felt, impregnated felt, plastics, and like materials compatible with the processing chemistries.

In one embodiment, a polishing fluid from a fluid source 240 may be applied to the polishing pad assembly 265 and/or the substrate 115 during processing. The fluid source 240 may also provide de-ionized water (DIW) to the polishing pad assembly 265 and/or the substrate 115 in order to facilitate cleaning. The fluid source 240 may also provide a gas, such as clean dry air (CDA), to the polishing pad assembly 265 in order to adjust pressure applied to the polishing pad assembly 265. The base 206 may be configured to include a basin to collect polishing fluid and/or DIW that has flowed off of the edges of the substrate 115.

Each of the one or more polishing pad assemblies 265 are coupled to a support arm 230 that moves the polishing pad assemblies 265 relative to the substrate 115. The support arms 230 are movably mounted on the base 206 by an actuator assembly 220. The actuator assembly 220 includes a first actuator 225A and a second actuator 225B. The first actuator 225A may be used to move each support arm 230 (with the respective polishing head 222) vertically (Z direction) and the second actuator 225B may be used to move each support arm 230 (with the respective polishing head 222) laterally (X direction, Y direction, or combinations thereof). The first actuator 225A may also be used to provide a controllable downforce that urges the polishing pad assemblies 265 towards the substrate receiving surface 205 and against the substrate 115. While only two support arms 230 and polishing heads 222 having polishing pad assemblies 265 thereon are shown in FIG. 2, the polishing station 200 is not limited to this configuration. The polishing station 200 may include any number of support arms 230 and polishing heads 222 as allowed by the circumference (e.g., the perimeter) of the chuck 210 as well as space for sweeping movement of the support arms 230 (with the polishing heads 222 and polishing pad assemblies 265 mounted thereon).

The actuator assembly 220 may comprise a linear movement mechanism 227, which may be a slide mechanism or ball screw coupled to the second actuator 225B. Likewise, each of the first actuators 225A may comprise a linear slide mechanism, a ball screw, or a cylinder slide mechanism that moves the support arm 230 vertically. The actuator assembly 220 also includes support arms 235A, 235B coupled between the first actuator 225A and the linear movement mechanism 227. Each of the support arms 235A, 235B may be actuated simultaneously or individually by the second actuator 225B. Thus, lateral movement of the support arms 230 (and polishing pad assemblies 265 mounted thereon) may sweep radially on the substrate (not shown) in a synchronized or non-synchronized manner.

A support shaft 242 may be part of the first actuator 225A. The support shaft 242 is disposed in an opening 244 formed in the base 206 that allows lateral movement of the support arms 230 based on the movement provided by the actuator assembly 220. The opening 244 is sized to allow sufficient lateral movement of the support shaft 242 such that the support arms 230 (and polishing heads 222 mounted thereto) may move from a perimeter 246 of the substrate receiving surface 205 toward the center thereof to about one half the radius of the substrate receiving surface 205. In one embodiment, the substrate receiving surface 205 has a diameter that is substantially the same as the diameter of a substrate that would be mounted thereon during processing. For example, if the radius of the substrate receiving surface 205 is 150 mm, the support arms 230, particularly the polishing pad assemblies 265 mounted thereon, may move radially from about 150 mm (e.g., from the perimeter 246) to about 75 mm inward toward the center of the substrate receiving surface 205, and back to the perimeter 246. The opening 244 is sized to allow sufficient lateral movement of the support shaft 242 such that an end 248 of the support arms 230 may be moved outward of a perimeter 250 of the chuck 210 such that the substrate 115 may be transferred onto or off of the substrate receiving surface 205 by the robot 122.

The support arms 230, particularly the polishing pad assemblies 265 mounted thereon, are moved according to a polishing routine utilized to polish local areas of the substrate 115. In some embodiments, the local areas of the substrate 115 may be the surface area occupied by a single one of the dies 340. The polishing pad assemblies 265 may be utilized to polish any area of a substrate 115 depending on the location(s) in need of polishing as defined by user specifications. Benefits of the disclosure include improved times and the reduction of errors in the setup for polishing individual areas on substrates. Embodiments of the polishing module as described herein may remove a material thickness of about 20 Angstroms (Å) to about 200 Å on a substrate, and in some embodiments, a material thickness of about 10 Å to about 200 Å may be removed. In some embodiments, the material may be removed with an accuracy of about +/−5 Å. Embodiments described herein may be used to perform thickness corrections on any film or silicon layer on local areas of a substrate and may also be used for edge bevel polishing.

A controller 290 may be attached to, or part of, the polishing station 200. The controller 290 includes a central processing unit (CPU) 292 and a system memory 294. The system memory 294 stores a software applications and data for use by the CPU 292. The CPU 292 runs software applications and may control the polishing station 200. The controller may additionally have port 293. The port 293 may support devices such as I/O devices (keyboards, video displays), network adapters, and/or other devices for providing input, storage, output, etc. . . . .

The controller 290 stores and executes programs to determine the removal amount and polishing parameters such as pressure, oscillation speed and the polish time required for each polishing area. Polish parameters, such as polish pressure, time, and oscillation speed, are some of the variables in each recipe step for each polish area and other parameters may be calculated and/or set in each recipe step. The collection of the recipe steps for each die 340, local area 342, or other portions of the entire substrate 115 become a polish recipe used for processing the substrate 115.

The controller 290 may obtain measurement data or other information concerning the substrate 115 from the metrology station 110, factory interface, FAB host controllers, or other devices. The controller 290 may store a plurality of data for determining the removal rate of material polished from the substrate 115. The removal rate data may be stored as formulas, i.e., graphs, tables, discrete points, or by other suitable methodology. The graphs may be assigned to particular locations for each die 340, larger areas on the substrate 115, or the substrate 115 in its entirety. The removal rate information for a particular location on the substrate 115 may be identified with the location information, such as a coordinate value, index value, or other suitable identifier.

Figure 4:
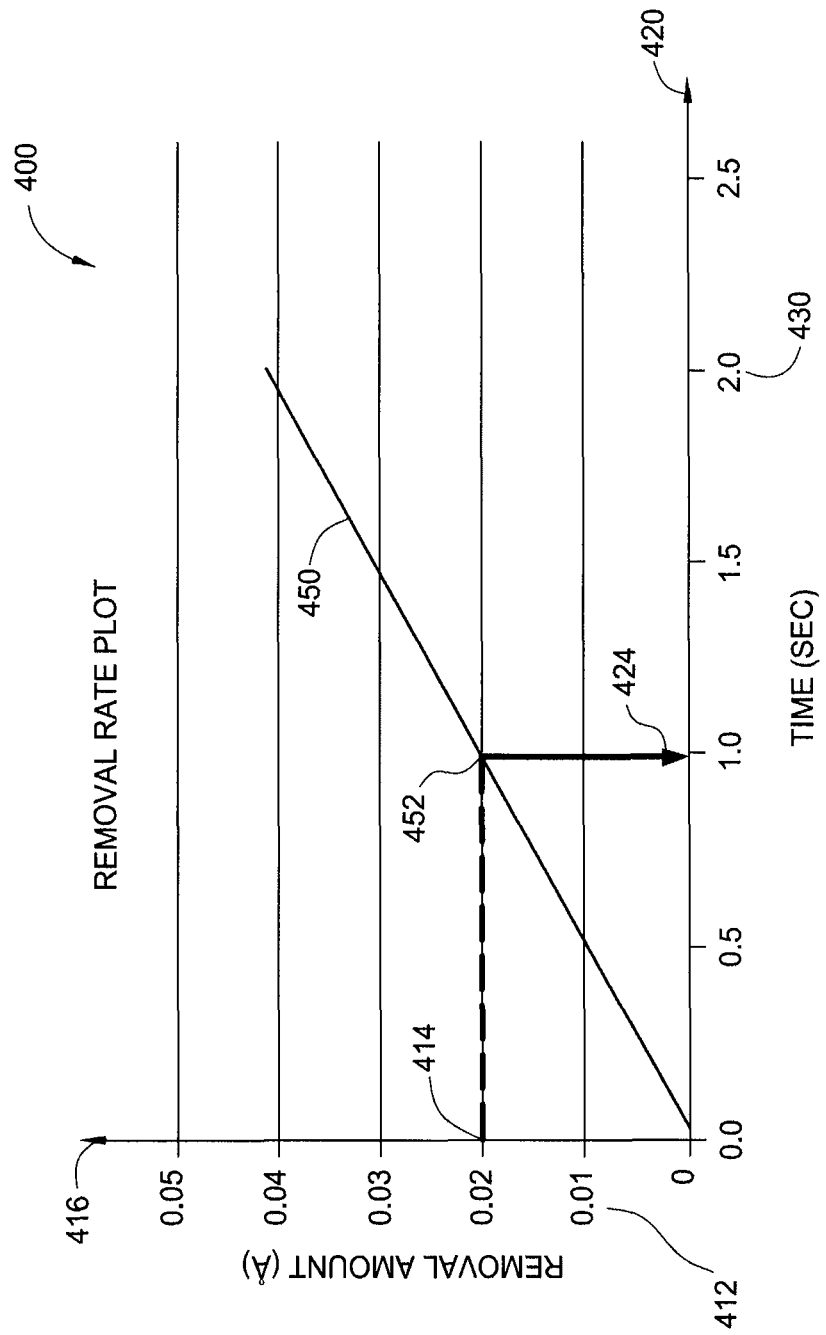
FIG. 4 is a graph depicting a calculated removal rate of material from the substrate by the polishing module shown in FIG. 1.
Figure 5:
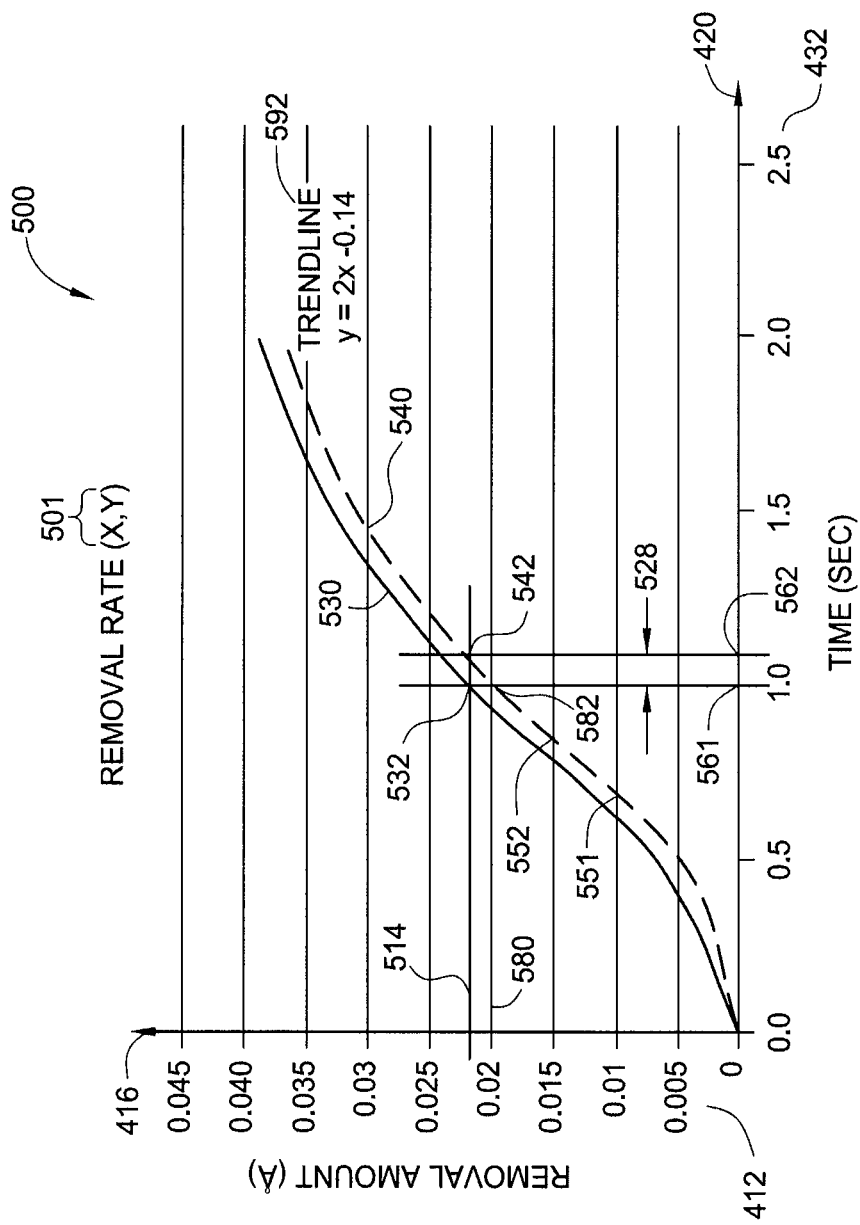
FIG. 5 is a graph depicting measured removal rates of material from the substrate by the polishing module shown in FIG. 1.

Turning briefly to FIGS. 4 and 5, the removal rate graphs depicting "removal amount versus polish time" are provided. These removal rate graphs may hold polishing pressure and oscillation speed constant for the polishing station 200. It should be appreciated that the removal rate graph may be particular to one particular combination of pressure and oscillation speed for the polishing station 200 in determining the removal rate of material while other removal rate graphs have a second combination of pressure and oscillation speed. For simplicity of further discussion, the pressure and oscillation speed will be held constant in the removal rate graphs. FIG. 4 is a graph 400 depicting a calculated removal rate of material from the substrate by the polishing module shown in FIG. 1. The graph 400 illustrates the material removal amount 412, along a y-axis 416, as a function of time 430 along an x-axis 420. It should be appreciated that the graph 400 alternately plots the material removal amount 412, along the x-axis 420, and time 430 along the y-axis 416. However, it should also be appreciated that the polish area does not necessarily scale with time or for that matter, pressure and oscillation speed of the polishing station 200.

Prior to polishing the substrate 115 at the polishing station 200, the "removal amount versus polish time" curve 450 is generated for each polishing operation, and optionally at each die location, on a calibration wafer. On an example first substrate (substantially similar to substrate 115) having 79 dies 340, there may be 79 graphs 400 corresponding to each die 340. Each graph 400 provides time 430 for populating the steps in the recipe used for polishing the first substrate. However, as briefly discussed above, the oscillation speed and pressure in the step may also be determined. Thus, 79 dies may have 79 associated graphs 400 used in generating 79 steps (one for the location of each die 340) in one polishing recipe used for the first substrate. A second substrate (substantially similar to substrate 115) may then have 79 different steps since the polishing time, or other polishing parameters, for each die 340 in the second substrate may have a different thickness at the various die locations compared to that of the first substrate. It should also be stated that the number of steps in the polishing recipe correspond to the number of polishing operations performed on the substrate regardless of the number of dies as some die locations may not be polished.

Alternately, the curve 450 may be calculated from predictive (such as by modeling) or predetermined values (such as by empirical data). In yet other alternatives, the curve 450 may be determined through past polishing operation data, or through other suitable techniques. In a first embodiment, the curve 450 is determined from predetermined values. After calibration is completed, production substrates 115 are premeasured on the metrology station 110 to determine thickness corrections, i.e., excess material to be removed at locations corresponding to each die 340 on the substrate 115. Having the material removal amount 412 as a function of time 430 provided by the curve 450, permits the controller of the polishing station 200 to quickly and automatically determine, or calculate, the amount of time 430 needed for to process the substrate at each die location to be polished the material removal amount 412, i.e., thickness corrections, and place the die 340 within specification, i.e., within the predetermined thickness and/or flatness tolerance. That is, the polishing station 200 automatically populates each step corresponding to each die location with the polishing time 430 for removing the material and automatically builds a polishing recipe for the particular substrate at hand. Thus, each recipe has a high probability of being unique due to the likelihood of varying times 430 for removing material at different die locations due to different material thickness, or flatness, determined by the metrology station 110.

In a purely illustrative example, the metrology station 110 may indicate a first die location $(X_1, Y_1)$ is too thick by about 0.02 Å. Referencing the graph 400, it can be found that the removal of 0.02 Å (314) of material intersects the curve 450 at a point 452 which in turn indicates a polishing time 424 of less than about 1 second. Thus, the polishing time 424 may automatically be derived and then populated into the step in the polishing recipe for the first die location $(X_1, Y_1)$. Measuring the substrate 115 after polishing at the metrology station 110 to determine the actual amount of material removed allows for corrections to the curve 450 to be used on subsequent substrates 115. This aspect will be discussed with reference to FIG. 5.

Alternately, the curve may be determined from the calibration wafer used to setup or qualify the polishing station 200. FIG. 5 is a graph 500 depicting measured removal rates of material from the substrate by the polishing station 200 shown in FIGS. 1 and 2. An initial curve 530 may be determined by plotting the time 430 used to polish away the material removal amount 412 from the calibration wafer. The initial curve 530 may be the same for each die location on the substrate 115. Values on the curve 530 may be extrapolated, trended, or average between the values measured from the calibration wafer for the purpose of building the initial curve 530.

In one example, the calibration wafer at a first die location 501 may be polished for a first time 561 of about 1 second. The first die location 501 on the calibration wafer is subsequently measured by the metrology station 110 to determine approximately a first amount of material removed 514. An intersection 532 of the first amount of material removed 514 and the first time 561 provides a data point for creating the curve 530. In practice, it is contemplated that the calibration wafer, and subsequent substrates 115 as well, would be polished at subsequent, possibly each, die locations prior to moving to the metrology station 110 for measurement. A plurality of measurements at the same first die location 501 on different substrates can be used to in the formation of the graph 500 particular to the first die location 501. For example, measurements may be taken after different polishing times 430 all at the same first die location 501. Alternately, measurements made for the plurality of dies locations on the substrates and the measurements may be incorporated into an initial curve 530 used for all die locations on the substrate. In one embodiment, all the die locations utilize the same graph 500 for determining the removal rate. In another embodiment, each die location has a separate (unique) graph 500 for determining the removal rate. The graphs 500 may be different for the die locations or areas on the substrate 115 due to variations from center to edge of the film quality and thickness among other reasons.

The graph 500 used for each die location may start out substantially the same and diverge as subsequent substrates 115 are polished and measured at the metrology station 110 with the metrology station 110 providing the measurements back to the polishing station 200 to modify (improve) the graph 500 at the die location associated with the graph 500. Alternately, a single graph 500 is used for all the die locations on the substrate and modified by the polishing results determined at the metrology station 110. In this manner the removal rate may be adjusted as the consumables are worn by the polishing station 200. Additionally, the measurement data from the post processed substrates may be used to indicate when consumables are in need of replacing. As the slope of the curve 530, i.e., the removal rate, approaches a predetermined lower limit, indicative of material removal taking longer and possibly more wear on the consumables, the consumables on the polishing station 200 may be reconditioned or replaced, such as the polishing pads or slurry.

After the substrates 115 are polished, the substrate 115 is post-measured on the metrology station 110, or in-situ, to determine if the substrate 115, or more particularly the die locations thereon, is within specification. As stated above, the measurements for the thickness of the dies 340 may be used to modify the graph 500 or send the substrate to be polished again in those die locations found still to be too thick. Returning to the example above for the first die location 501 polished for a period of the first time 561 by the polishing station 200, the substrate 115 may be measured post polishing at the first die location 501. The thickness measured may indicate that an actual material removal amount 580 is less than predicted by the curve 530 and thus an actual removal rate 582 may require an adjustment 528 of the curve 530 to the location of a new curve 540. The new curve 540 now shows the time 430 for the actual removal rate 582 corresponding to the first time 561. Furthermore, we may now determine a new time 562 for achieving the correct first amount of material removed 514 and subsequent polishing operations may use the new time 562 in their steps for polishing in and around the first die location 501 on future substrates. A trend line 592 illustrates an example function which may be used for predicting the polishing rates at the first die location 501. The polishing station 200 may also adjust the graphs 500 for each die location in a similar fashion or may adjust only those graphs of nearby dies based on the movement of the curve for the first die location 501.

In summary, each measurement point of the substrate provides measurement coordinate (x,y) location and thickness information to controller 190 on the polishing station 200, and based on the user defined target thickness, the polishing station 200 determines the material removal amount 412 and the polish time 430 required for each polishing area, i.e., die location. Polish parameters, such as polish pressure, time, and operation speed, are inserted automatically in each recipe step for each polish area. The collection of the recipe steps becomes the polishing recipe used for a particular substrate 115. After the substrate 115 is polished on the polishing station 200, the substrate 115 is measured again at the metrology station 110 or other suitable location and the thickness data is sent back to the polishing station 200 to generate and adjust the removal rate information (graph) used for developing polishing recipes on a subsequent substrate.

Figure 6:
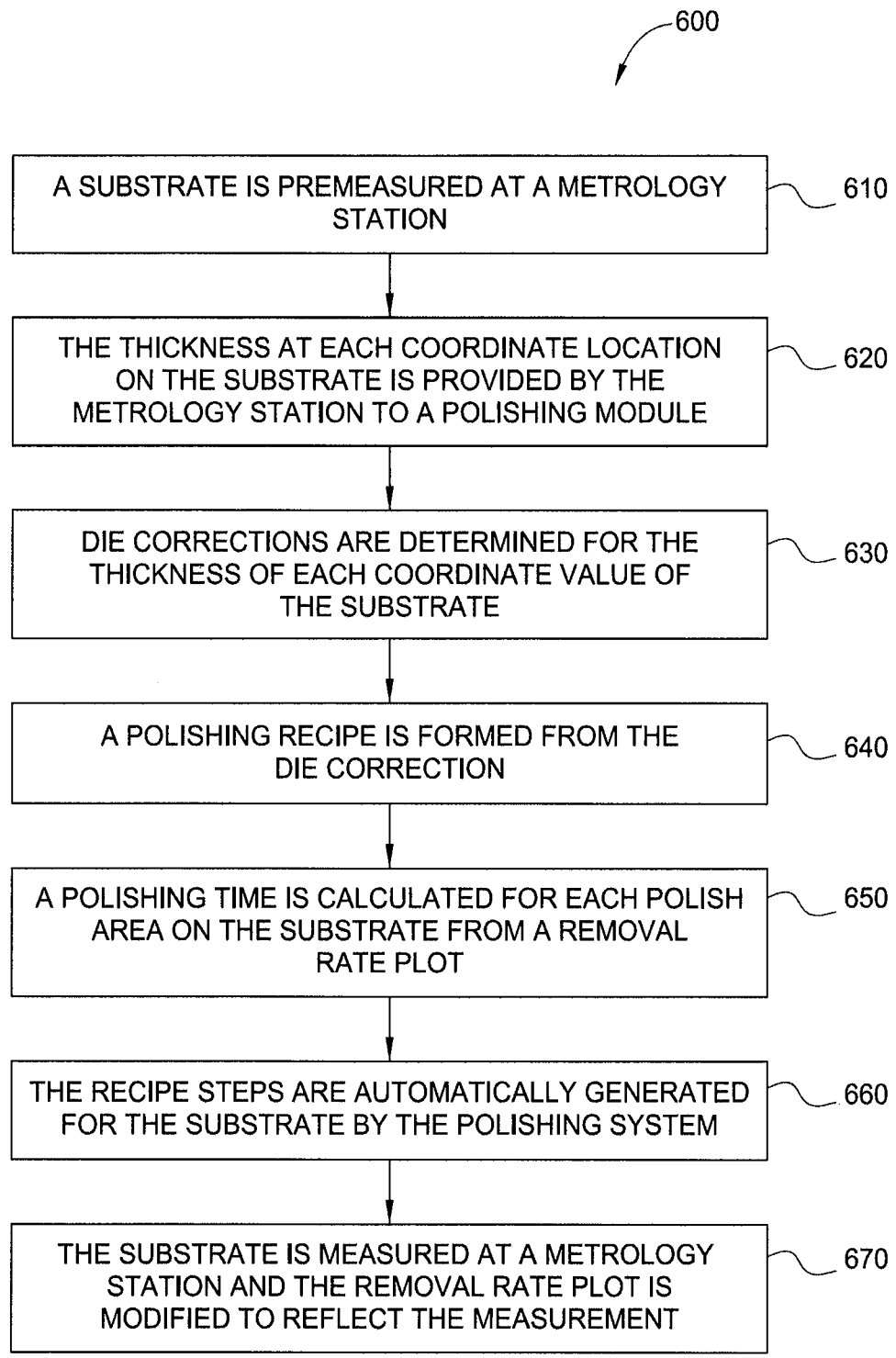
FIG. 6 is a schematic flow chart showing a polishing operation for a substrate, according to an embodiment of the invention.

FIG. 6 is a schematic flow chart showing a polishing operation for a substrate, according to an embodiment of the invention. The method 600 begins at step 610 where a substrate is premeasured at a metrology station. The metrology station measures the thickness at each coordinate location corresponding to a future die. At step 620, the thickness at each coordinate location on the substrate is provided by the metrology station to a polishing system.

At step 630, die corrections (thickness corrections) are determined for the thickness of each die location on the substrate. The die location may be defined on the substrates by a metes and bounds of the planned dies established through a local coordinate system. For example, an (X,Y) coordinate value may indicate a lower left start location for a die of a known size and orientation. In this manner, each die location may be mapped out on the surface of the substrate. The die corrections may be formed by comparing a defined target thickness for the die location with the measured thickness. The die corrections correspond to the deviation from the target specification and the amount of polishing to be performed at each location to remove material and bring the die location into specification. In instances where the die correction is less than or about zero, the die correction may be set to zero as the removal of material, or thinning of the particular die location, may not be desired.

At step 640, a polishing recipe is formed from the die corrections. A number of polishing steps required is inserted into the recipe. In the polishing recipe, various input, such as the numeric value of the die correction, and polishing process parameters are provided for each die location corresponding to a step in the recipe. The x and y offset on the substrate defining the die location, along with a width and height of the die, is used to define each polish area of the substrate. Thus, there may be a substantially equivalent number of dies to polish areas and they may be coincident.

At step 650, polishing time is calculated for each polish area on the substrate. Additionally, the polishing pressure and oscillation speed, as well as other polishing parameters, may be calculated for each polish area on the substrate. The polishing time is derived from removal amount (y-axis) versus time (x-axis) curves plotted on a graph, hereinafter removal rate graph. The removal rate graph may similarly plot time, on the y-axis, versus the amount of material to be removed, on the x-axis. A single removal rate graph may correspond to the entire surface of the substrate such that each die location uses the same removal rate graph to arrive at polishing times for each die location in the polishing recipe. Alternately, a plurality of removal rate graphs may each correspond to a discrete die location on the substrate. In this manner, the removal amount at each die location has a corresponding curve plot for determining the polishing time for the die correction at each die location. In yet another alternate variation, the removal rate graph may correspond to a group of dies, or an area of the substrate. In yet other embodiments, each removal rate graph may additionally correspond to a unique set of polishing pressures and oscillation speeds.

An initial removal rate graph may be generated from a startup or calibration wafer. Alternately, the initial removal rate graph may be calculated from a theoretical or predictive outcome. Such a predictive outcome may utilize the length of service life left in the consumables. Alternately still, the initial removal rate graph may be derived from the last substrate processed in the polishing system. The removal rate graph may be adjusted during processing by determining the actual removal rates from measuring substrates post polishing and comparing the results with the recipe derived from the removal rate graph. For example, the removal rate graph may indicate a removal time of about 3 seconds will remove about 3 angstroms of material from a particular die location on the substrate. After measuring that particular die location post polishing, the difference in material removed can be fed back and used to adjust the removal rate graph for use on subsequent substrates to more accurately derive polishing times to remove material. The adjustment of the removal rate graph may correspond to the plot moving to the value at the intersection of the time value on the removal rate graph associated with the actual amount of material removed. In some instances, the discrete values on the removal rate graph may be smoothed locally in and around the measured or altered removal rate values.

At step 660, the recipe steps are automatically generated for the substrate. Recipe steps contain information for each die location such as polish time, operation mode, polish location, and die size for each die. Additionally, the recipe steps contain a plurality of polishing parameters, such as polishing pressure and oscillation speed for polishing each die location. The recipe step applies the polishing time to a particular die location for removing the desired corrective amount of material from the die location to place the substrate and the die location within specification. The polishing system is suitably adapted for polishing a single die location with each step in the polishing recipe. On a single substrate there may be over 100 die locations and therefore an equal amount of polishing steps in the polishing recipe. Advantageously, the automatic generation of the polishing steps in each polishing recipe significantly reduces the time for an operator to create individual recipes and reduces polishing errors for each die making the polishing system better suited for production and reducing the overall costs for each die.

The controller may select the recipe steps and organize the recipe steps for directing the polishing operations on the substrate. Thus, the polishing module may organize the polishing steps to be executed in a particular order. The polishing module may order the steps to obtain a high efficiency, as measured by polishing processing time, of material removal. For example, the polishing module may organize the recipe steps by the amount of material to be removed and polish those respective dies first or possibly together if spatially convenient. Alternately, the polishing module may organize the recipe steps by location and polish the die locations in a sequential fashion moving from one side of the substrate to the other. In yet other alternatives, the polishing module may organize the recipe steps by polishing parameters, such as pressure and oscillation speed, to perform similarly configured steps in sequence. Thus, the polishing recipes for polishing the substrate are internally organized to determine a sequence, or ordering, for efficiently polishing each die on the substrate.

At step 670, the substrate is measured at a metrology station. After all die locations are corrected by polishing the thickness of each die location using the automatically generated polishing recipe steps, the substrate is measured at the metrology station and the metrology tool feeds data back to the polishing system to adjust the plot curves used to calculate the removal rate for the next substrate to be polished. The real-time feedback provided for altering the removal rate graph ensures the dies are within specification upon completion of the polishing operation even with the polishing station showing signs of wearing the consumables.

The benefits to the method utilized by the polishing module to develop the polishing recipes for polishing local areas of the substrate include improved times and the reduction of errors in the setup for polishing individual areas on substrates. Embodiments of the polishing module as described herein may remove a material thickness of about 20 Angstroms (Å) to about 200 Å on a local area (i.e., die) located on a substrate with an accuracy of about +/−5 Å. Advantageously the thickness corrections on any film or silicon on the local areas of a substrate may also be utilized in a production environment to correct out of specification die locations at a significantly reduced cost.

The implement of automated recipe generation saves a significant amount of time otherwise spent on creating polish recipe for each die on a substrate making the polishing suitable for production environments. The invention reduces the potential for recipe mistakes introduced through human error. Furthermore, consumable wear can be negated and monitored prior to affecting the polishing operations. These advantages improve overall operation efficiency. This in turn makes die level polishing practical for use at both the R&D and manufacturing level extending the operations to the processing environment.

While the foregoing is directed to embodiments of the present disclosure, other and further embodiments of the disclosure may be devised without departing from the basic scope thereof, and the scope thereof is determined by the claims that follow.

The invention claimed is:

1. A method of polishing a substrate, comprising:
   premeasuring thickness at selected locations on the substrate at a metrology station, each location corresponding to a location of a single die;
   providing the thicknesses obtained using the metrology station for the selected locations of the substrate to a controller of a polishing module;
   determining thickness corrections for each selected location on the substrate;
   forming a step in a polishing recipe from the thickness corrections for each selected location; and
   calculating a polishing parameter for each selected location.

2. The method of claim 1, further comprising:
polishing each die location with a respective step in the polishing recipe associated with that die location.

3. The method of claim 2, further comprising:
polishing a second die location on the substrate with a second step.

4. The method of claim 1, wherein the calculating the polishing time comprises:
comparing the die corrections to a removal rate curve to determine the polishing parameter inclusive of one or more of polishing time, polishing pressure, and oscillation speed.

5. The method of claim 4 further comprising:
measuring the substrate at a metrology station post polishing; and
adjusting the removal rate curve to reflect the post polishing measurement and the polishing time used to polish the die location.

6. The method of claim 4, further comprising:
determining the sequence of steps for polishing of each die on the substrate on the substrate to minimize polishing time.

7. A computer-readable storage medium storing a program, which, when executed by a processor performs an operation for polishing a substrate, the operation comprising:
premeasuring thickness at selected locations on the substrate at a metrology station, each location corresponding to a location of a single die;
providing the thicknesses obtained using the metrology station for the selected locations of the substrate to a controller of a polishing module;
determining thickness corrections for each selected location on the substrate;
forming a step in a polishing recipe from the thickness corrections for each selected location; and
calculating a polishing parameter for each selected location.

8. The computer-readable storage medium of claim 7, further comprising:
polishing each die location with a respective step in the polishing recipe associated with that die location.

9. The computer-readable storage medium of claim 8, further comprising:
polishing a second die location on the substrate with a second step.

10. The computer-readable storage medium of claim 7, wherein the calculating the polishing time comprises:
comparing the die corrections to a removal rate curve to determine the polishing parameter inclusive of one or more of polishing time, polishing pressure, and oscillation speed.

11. The computer-readable storage medium of claim 10 further comprising:
measuring the substrate at a metrology station post polishing; and
adjusting the removal rate curve to reflect the post polishing measurement and the polishing time used to polish the die location.

12. The computer-readable storage medium of claim 10, further comprising:
determining the sequence of steps for polishing of each die on the substrate to minimize polishing time.

13. A system, comprising:
a processor; and
a memory, wherein the memory includes an application program configured to perform an operation for generating polishing recipes, comprising:
premeasuring thickness at selected locations on the substrate at a metrology station, each location corresponding to a location of a single die;
providing the thicknesses obtained using the metrology station for the selected locations of the substrate to a controller of a polishing module;
determining thickness corrections for each selected location on the substrate;
forming a step in a polishing recipe from the thickness corrections for each selected location; and
calculating a polishing parameter for each selected location.

14. The system of claim 13, further comprising:
polishing each die location with a respective step in the polishing recipe associated with that die location.

15. The system of claim 14, further comprising:
polishing a second die location on the substrate with a second step.

16. The system of claim 13, wherein the calculating the polishing time comprises:
comparing the die corrections to a removal rate curve to determine the polishing parameter inclusive of one or more of polishing time, polishing pressure, and oscillation speed.

17. The system of claim 16 further comprising:
measuring the substrate at a metrology station post polishing; and
adjusting the removal rate curve to reflect the post polishing measurement and the polishing time used to polish the die location.

18. The system of claim 16, further comprising:
determining the sequence of steps for polishing of each die on the substrate to minimize polishing time.

* * * * *